(12) United States Patent
Oh et al.

(10) Patent No.: US 9,249,963 B2
(45) Date of Patent: Feb. 2, 2016

(54) LIGHT EMITTING DEVICE

(71) Applicant: LG INNOTEK CO., LTD., Seoul (KR)

(72) Inventors: Jeong Taek Oh, Seoul (KR); Yu Won Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/357,091

(22) PCT Filed: Nov. 1, 2012

(86) PCT No.: PCT/KR2012/009140
§ 371 (c)(1),
(2) Date: May 8, 2014

(87) PCT Pub. No.: WO2013/069924
PCT Pub. Date: May 16, 2013

(65) Prior Publication Data
US 2014/0300267 A1    Oct. 9, 2014

(30) Foreign Application Priority Data

Nov. 8, 2011 (KR) .................. 10-2011-0116053
Dec. 18, 2011 (KR) .................. 10-2011-0136915

(51) Int. Cl.
*H05B 33/02* (2006.01)
*H01L 33/00* (2010.01)
(Continued)

(52) U.S. Cl.
CPC . *F21V 29/20* (2013.01); *F21K 9/56* (2013.01); *H01L 33/507* (2013.01); *H01L 33/60* (2013.01); *H01L 33/644* (2013.01); *H01L 33/504* (2013.01); *H01L 33/505* (2013.01); *H01L 33/508* (2013.01); *H01L 2224/48091* (2013.01)

(58) Field of Classification Search
CPC ..... F21V 29/20; H01L 33/644; H01L 33/507; H01L 33/60; H01L 33/504; H01L 2224/48091; H01L 33/505; H01L 33/508; F21K 9/56
See application file for complete search history.

(56) References Cited

U.S. PATENT DOCUMENTS

2004/0207999 A1   10/2004  Suehiro et al.
2006/0034084 A1*   2/2006  Matsuura et al. ............. 362/293
(Continued)

FOREIGN PATENT DOCUMENTS

JP      2004-281605 A    10/2004
KR   10-2010-0129766 A    12/2010
(Continued)

OTHER PUBLICATIONS

Office Action dated Sep. 16, 2014 in Taiwanese Application No. 101141216.
(Continued)

*Primary Examiner* — Donald Raleigh
(74) *Attorney, Agent, or Firm* — Saliwanchik, Lloyd & Eisenschenk

(57) ABSTRACT

Disclosed is a light emitting device. The light emitting device includes a body having a cavity, a light emitting part in the cavity, a reflective layer on an inner surface of the cavity, and a light conversion layer adjacent to the reflective layer. The light emitting device includes a body having the cavity, a light emitting part in the cavity, and a light conversion part on a path of a light from the light emitting part. The light conversion part includes a first light conversion lens part, and a second light conversion lens part beside the first light conversion lens part.

10 Claims, 7 Drawing Sheets

(51) Int. Cl.
*F21V 29/00* (2015.01)
*H01L 33/60* (2010.01)
*F21K 99/00* (2010.01)
*H01L 33/64* (2010.01)
*H01L 33/50* (2010.01)

(56) References Cited

U.S. PATENT DOCUMENTS

| | | | |
|---|---|---|---|
| 2007/0246712 A1 | 10/2007 | Kim et al. | |
| 2009/0236621 A1 | 9/2009 | Chakraborty | |
| 2009/0295265 A1* | 12/2009 | Tabuchi et al. | 313/112 |
| 2011/0001422 A1* | 1/2011 | Aanegola et al. | 313/501 |
| 2011/0018016 A1 | 1/2011 | Bierhuizen et al. | |
| 2012/0044667 A1* | 2/2012 | Hanawa et al. | 362/97.1 |
| 2012/0228564 A1 | 9/2012 | Hashimoto et al. | |
| 2012/0235192 A1* | 9/2012 | Lin et al. | 257/98 |
| 2012/0292631 A1* | 11/2012 | Katsuno et al. | 257/76 |
| 2013/0119419 A1* | 5/2013 | Vadhavkar et al. | 257/98 |

FOREIGN PATENT DOCUMENTS

| | | |
|---|---|---|
| KR | 10-2011-0108147 A | 10/2011 |
| TW | 2009-24160 A | 6/2009 |
| TW | M383202 U1 | 6/2010 |
| TW | 2011-18132 A | 6/2011 |

OTHER PUBLICATIONS

International Search Report in International Application No. PCT/KR2012/009140, filed Nov. 1, 2012.
Office Action dated Nov. 21, 2012 in Korean Application No. 10-2011-0136915.
European Search Report in European Application No. 12848029.0, dated Apr. 22, 2015.

* cited by examiner

LIGHT EMITTING DEVICE

CROSS-REFERENCE TO RELATED APPLICATIONS

This application is the U.S. national stage application of International Patent Application No. PCT/KR2012/009140, filed Nov. 1, 2012, which claims priority to Korean Application Nos. 10-2011-0116053 and 10-2011-0136915, filed Nov. 8, 2011 and Dec. 18, 2011, respectively, the disclosures of each of which are incorporated herein by reference in their entirety.

TECHNICAL FIELD

The embodiment relates to a light emitting device.

BACKGROUND ART

Recently, methods of fabricating nitride gallium (GaN)-based white light emitting diodes (LED), which have actually been researched and studied all over the world, are mainly classified into two methods, in which one method is to acquire a white color by combining a phosphorous material on a blue LED chip or a UV LED chip in the form of a single chip, and the other method is to acquire the white color by combining two or three LED chips with each other in the form of a multiple-chip.

A representative method of realizing a white LED through the form of the multiple-chip is to combine three RGB chips with each other. According to the method, the operating voltage is irregularly represented in each chip, and the output of each chip varies according to the surrounding temperatures so that a color coordinate is changed.

Due to the above problem, the form of the multiple-chip is suitable for a special lighting field of requiring the realization of various colors by adjusting the intensity of each LED through a circuit structure instead of the realization of the white LED.

Accordingly, in order to realize the white LED, a binary system, in which a blue LED easily fabricated and representing superior efficiency and a phosphor pumped by the blue LED to emit yellow light are combined with each other, has been representatively used.

The binary system mainly employs a white LED realized by using the blue LED as a pumping light source and by pumping a yttrium aluminum garnet (YAG) phosphor, which is activated by $Ce^{3+}$ (which is a trivalent rare earth element), that is, a YAG:Ce phosphor by the light output from the blue LED.

In addition, the white LED is packaged and used in various forms according to the application fields thereof. Representatively, the white LED is manly used in an ultra micro-size LED device having the type of a surface mounting device (SMD) applicable to backlighting of a cellular phone and a vertical lamp type LED device for an electric board and a solid state display device or an image display.

Meanwhile, indexes used to analyze the characteristic of white light include a correlated color temperature (CCT) and a color rendering index (CRI).

The CCT refers to the temperature of a black body on the assumption the temperature of the black body matches with the temperature of an object when the color of a visible ray emitted from the object seems to be identical to the color radiated from the black body. As the color temperature is increased, a dazzling bluish white color is represented.

In other words, white light having a low color temperature is expressed warmly, and white light having a high color temperature is expressed coldly. Therefore, the white light can satisfy even the characteristic of a special lighting field requiring various colors by adjusting color temperatures.

According to the related art, the white LED using the YAG:Ce phosphor represents only a color temperature of 6000K to 8000K. In addition, the CRI represents the color difference of an object when the sunlight is irradiated onto the object and when other artificial lighting is irradiated onto the object. When the color of the object is identical to the color of the sunlight, the CRI is defined as 100. In other words, the CRI is an index representing the approximation degree of the color of the object under artificial lighting to the color of the object under the sunlight, and has a numeric value of 0 to 100.

In other words, a white light source having a CRI approximating 100 provides a color of an object approximately matching with a color of the object perceived by a human eye under the sunlight.

Recently, when comparing with an incandescent lamp having the CRI of over 80, and the fluorescent lamp having the CRI of over 75, a commercialized white LED represents the CRI of about 70 to about 75.

Therefore, the white LED employing the YAG:Ce phosphor according to the related art represents a relatively low CCT and a relatively low CRI.

In addition, since only the YAG:Ce phosphor is used, the adjustment of the color coordinate, the CCT, and the CRI may be difficult.

In relation to a light emitting diode employing a phosphor as described above, Korean Unexamined Patent Publication No. 10-2005-0098462 has been published.

DISCLOSURE OF INVENTION

Technical Problem

The embodiment provides a light emitting device which can be easily fabricated with improved color reproducibility, improved optical characteristics, and improved reliability.

Solution to Problem

According to the embodiment, there is provided a light emitting device including a body having a cavity, a light emitting part in the cavity, a reflective layer on an inner surface of the cavity, and a light conversion layer adjacent to the reflective layer.

According to the embodiment, there is provided a light emitting device including a body having a cavity, a light emitting part on a bottom surface of the cavity, a light conversion layer spaced apart from the light emitting part and provided between an inner surface of the cavity and the light emitting part, and a reflective layer between the light conversion layer and the inner surface of the cavity.

According to the embodiment, there is provided a light emitting device including a body having the cavity, a light emitting part in the cavity, and a light conversion part on a path of a light from the light emitting part. The light conversion part includes a first light conversion lens part, and a second light conversion lens part beside the first light conversion lens part.

According to the embodiment, there is provided a light emitting device including a substrate, a light emitting part on the substrate, a heat radiation part covering the light emitting part, and a light conversion part on the light emitting part.

Advantageous Effects of Invention

As described above, according to the light emitting device of the embodiment, the reflective layer is provided adjacent to the light conversion layer. Accordingly, after the wavelength of the light emitted from the light emitting part has been incident into the light conversion layer, the wavelength of the light may be instantly converted. In addition, the wavelength of the light emitted from the light emitting part may be converted after the light has passed through the light conversion layer, reflected by the reflective layer 500, re-incident into the light absorbing layer.

As described above, the light emitting device of the embodiment can effectively convert the wavelength of the light emitted from the light emitting part by forming the reflective layer on the light conversion layer.

Accordingly, the light emitting device according to the embodiment can represent improved light conversion efficiency and improved color reproducibility.

In addition, the light conversion layer may be formed on a region adjacent to the reflective layer, for example, only on the reflective surface of the reflective layer without forming on the internal entire portion of the cavity. Therefore, according to the light emitting device of the embodiment, the use of the light conversion particles such as quantum dots used in the light conversion layer can be reduced. Therefore, the light emitting device according to the embodiment can be easily fabricated at a low cost In addition, the light conversion layer is formed on the inner surface of the cavity while being spaced apart from the light emitting part. Therefore, the light conversion layer may be prevented from being degraded due to heat emitted from the light emitting part. Accordingly, the light emitting device according to the embodiment may represent improved reliability and improved durability.

In addition, according to the light emitting apparatus of the embodiment, the characteristics such as the orientation angle of out light can be adjusted according to wavelengths by using a plurality of light conversion lens parts. In other words, the light having a shorter wavelength band is emitted from the first light conversion lens part, and the light having a longer wavelength band is emitted from the second light conversion lens part.

In other words, the sizes and the radiuses of curvature of the first to third light conversion part and the concentration of the light conversion particles can be properly adjusted. Accordingly, the light emitting device according to the embodiment may emit lights representing required characteristics according to the wavelength bands.

In addition, the light emitting device according to the embodiment can easily adjust the color coordinates by adjusting the sizes of the first to third light conversion lens parts.

Therefore, the light emitting device according to the embodiment can emit light having a required wavelength band at a required position from the optical axis of the light emitting part. In other words, the light emitting device according to the embodiment can properly adjust the positions according to the required wavelength bands by using the light conversion pattern.

Therefore, the light emitting device according to the embodiment can represent improved light emission characteristics.

The light conversion lens parts include convex curved surfaces. In particular, the light conversion lens parts may be convex in a direction away from the light emitting part. Therefore, the contact area between the light conversion lens parts and the capping part to cover the light conversion lens parts is increased, and the heat emitted from the light conversion lens parts may be easily discharged through the second capping part.

Therefore, the light emitting device according to the embodiment can reduce the performance degradation caused by heat, and can represent improved reliability and improved durability.

MODE FOR THE INVENTION

Figure 1:
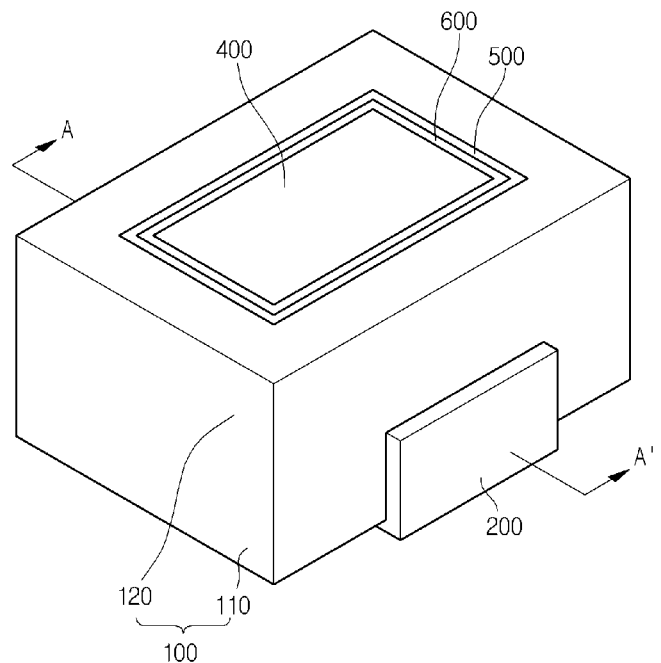
FIG. 1 is a perspective view showing a light emitting device package according to the first embodiment.

In the description of the embodiments, it will be understood that when, a substrate, a frame, a sheet, a layer or a pattern is referred to as being "on" or "under" another substrate, another frame, another sheet, another layer or another pattern, it can be "directly" or "indirectly" on the other substrate, the other frame, the other sheet, the other layer or the other pattern, or one or more intervening layers may also be present. Such a position of the layer has been described with reference to the drawings. The size of each element shown in the drawings may be exaggerated, omitted or schematically drawn for the purpose of convenience or clarity. In addition, the size of the element does not utterly reflect an actual size.

Figure 2:
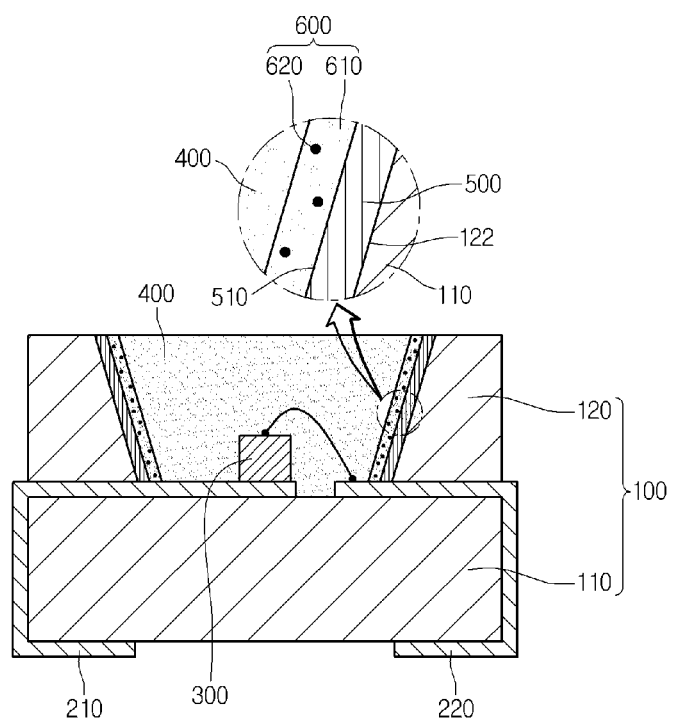
FIG. 2 is a sectional view taken along line A-A' of FIG. 1.
Figure 3:
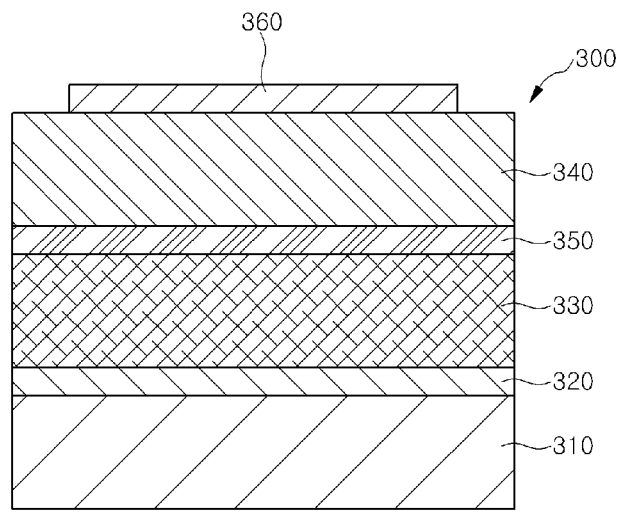
FIG. 3 is a sectional view showing a light emitting diode chip.
Figure 4:
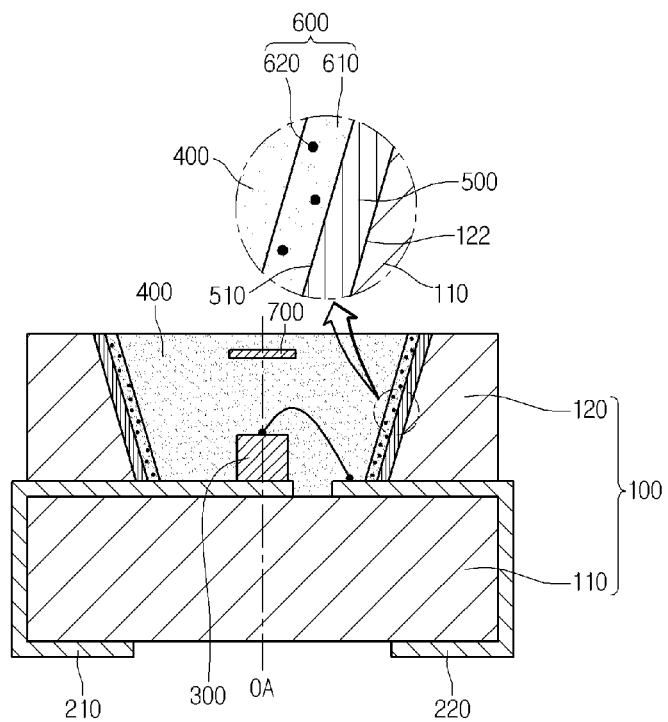
FIGS. 4 to 6 are sectional views showing a light emitting device package according to the modification of the first embodiment.
Figure 5:
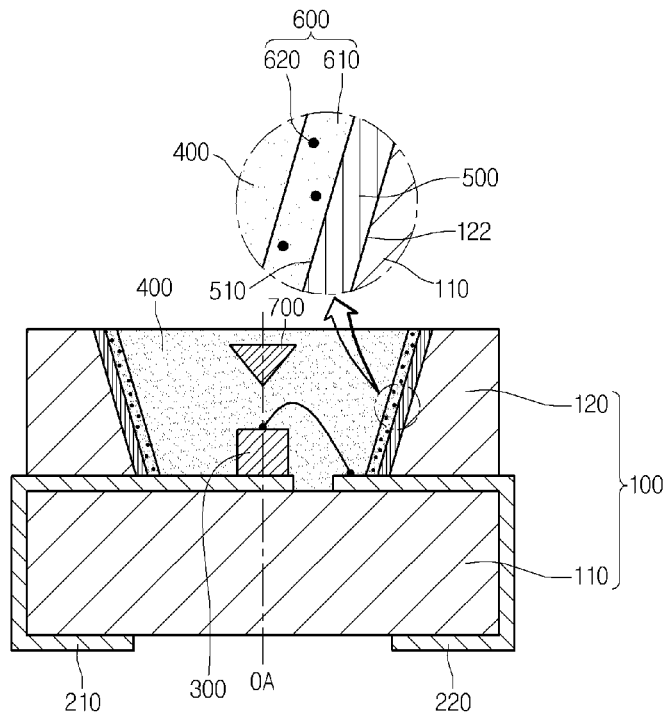
Figure 6:
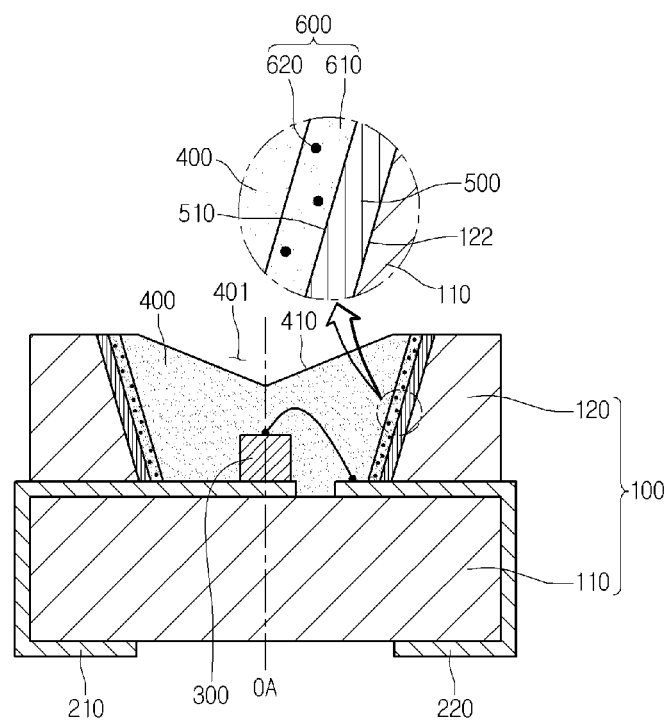

FIG. 1 is a perspective view showing a light emitting device package according to the first embodiment, FIG. 2 is a sectional view taken along line A-A' of FIG. 1, and FIG. 3 is a sectional view showing a light emitting chip. FIGS. 4 to 6 are sectional views showing the light emitting device package according to the modification of the first embodiment.

Referring to FIGS. 1 to 6, the light emitting diode package according to the first embodiment includes a body 100, a plurality of lead electrodes 210 and 220, a light emitting part 300, a filling part 400, a reflective layer 500 and a light conversion layer 600.

The body 100 receives the light emitting part 300, the filling part 400, the reflective layer 500, and the light conversion layer 600 and supports the lead electrodes 210 and 220.

The body 100 may include any one among a resin material such as PPA, a ceramic material, a liquid crystal polymer (LCP), SPS (Syndiotactic), PPS (Poly(phenylene ether)), and a silicon material. However, the embodiment is not limited thereto. The body 100 may have an integral structure through an injection molding scheme, or a stack structure including a plurality of layers.

The body 100 includes a cavity C having an open upper portion. The cavity C may be formed by performing a patterning, punching, cutting, or etching process with respect to the body 100. In addition, the cavity C may be formed by using a metallic frame having the shape of the cavity C when the body 100 is molded.

The shape of the cavity C may include a cup shape, or a concave container shape. The surface of the cavity C may have a circular shape, a polygonal shape, or a random shape, but the embodiment is not limited thereto.

An inner surface 122 of the cavity C may be perpendicular to a bottom surface of the cavity C or inclined with respect to the bottom surface of the cavity C based on the light emitting angle of the light emitting diode package.

The body 100 includes a base part 110 and a receiving part 120.

The base part 110 supports the receiving part 120. In addition, the base part 110 supports the lead electrodes 210 and 220. For example, the base part 110 may have a rectangular shape.

The receiving part 120 is provided on the base part 110. The cavity C is defined by the receiving part 120. In other words, the cavity C is a groove formed in the receiving part 120. The receiving part 120 surrounds the peripheral portion of the cavity C. The receiving part 120 may have the shape of a closed loop when viewed from the top. For example, the receiving part 120 may have the shape of a wall surrounding the cavity C.

The receiving part 120 includes a top surface, an outer surface 121, and the inner surface 122. The inner surface 122 is inclined with respect to the top surface 121.

The lead electrodes 210 and 220 may be realized by using lead frames, but the embodiment is not limited thereto.

The lead electrodes 210 and 220 are provided in the body 100. The lead electrodes 210 and 220 are electrically insulated from each other on the bottom surface of the cavity C. The outer portions of the lead electrodes 210 and 220 may be exposed outside the body 100.

The end portions of the lead electrodes 210 and 220 may be provided at one side of the cavity C or an opposite side of the cavity C.

The lead electrodes 210 and 220 may include lead frames. The lead frames may be formed when performing the injection-molding with respect to the body 100. The lead electrodes 210 and 220 may include the first lead electrode 210 and the second electrode 220.

The first and second lead electrodes 210 and 220 are spaced apart from each other. The first and second lead electrodes 210 and 220 are electrically connected to the light emitting part 300.

The light emitting part 300 includes at least one light emitting diode chip. For example, the light emitting part 300 may include a color light emitting diode chip or an UV light emitting diode chip.

The light emitting part 300 may include a horizontal light emitting diode chip or a vertical light emitting diode chip. As shown in FIG. 3, the light emitting part 300 may include a conductive substrate 310, a light reflective layer 320, a first conductive semiconductor layer 330, a second conductive semiconductor layer 340, an active layer 350, and a second electrode 360.

The conductive substrate 310 includes a conductor. The conductive substrate 310 supports the light reflective layer 320, the first conductive semiconductor layer 330, the second conductive semiconductor layer 340, the active layer 350, and a second electrode 360.

The conductive substrate 310 is connected to the first conductive semiconductor layer 330 through the light reflective layer 320. In other words, the conductive substrate 310 serves as a first electrode to apply an electrical signal to the first conductive semiconductor layer 330.

The light reflective layer 320 is provided on the conductive substrate 310. The light reflective layer 320 reflects upward light emitted from the active layer 350. In addition, the light reflective layer 320 is a conductive layer. Accordingly, the light reflective layer 320 connects the conductive substrate 310 to the first conductive semiconductor layer 330. The light reflective layer 320 may include metal such as silver (Ag) or aluminum (Al).

The first conductive semiconductor layer 330 is provided on the light reflective layer 320. The first conductive semiconductor layer 330 has a first conductive type. The first conductive semiconductor layer 330 may include an N type semiconductor. For example, the first conductive semiconductor layer 330 may include an N type GaN layer.

The second conductive semiconductor layer 340 is provided on the first conductive semiconductor layer 330. The second conductive semiconductor layer 340 may face the first conductive semiconductor layer 330 and may include a P type semiconductor. For example, the second conductive semiconductor layer 340 may include a P type GaN layer.

The active layer 350 is interposed between the first and second conductive semiconductor layers 330 and 340. The active layer 350 has a single quantum well structure or a multiple-quantum well structure. The active layer 350 may be formed in the stack structure of an InGaN well layer and an AlGaN barrier layer, the stack structure of an InGaN well layer and a GaN barrier layer. The light emitting material of the active layer 350 may vary according to light emission wavelengths such as a blue wavelength, a red wavelength, or a green wavelength.

The second electrode 360 is provided on the second conductive semiconductor layer 340. The second electrode 360 makes contact with the second conductive semiconductor layer 340.

Alternatively, the light emitting part 300 may include a horizontal LED. In this case, the horizontal LED may require an additional wiring so that the horizontal LED is connected to the first lead electrode 210.

The light emitting part 300 is connected to the first lead electrode 210 through a bump. The light emitting part 300 may be connected to the second lead electrode 220 through a wire. In particular, the light emitting part 300 may be directly provided on the first lead electrode 210.

In addition, the light emitting part 300 may be connected to the lead electrodes through various connection schemes such as a wire bonding scheme, a die bonding scheme, or a flip-bonding scheme without the above connection scheme. However, the embodiment is not limited thereto.

The filling part 400 is formed in the cavity C. The filling part 400 is transparent. The filling part 400 may include a material such as silicon or epoxy, or a material representing the reflective index of 2 or less. The filling part 400 covers the light emitting part 300. The filling part 400 may directly make contact with the light emitting part 300.

The reflective layer 500 is provided in the body 100. In more detail, the reflective layer 500 is provided in the cavity C. In more detail, the reflective layer 500 may be provided on the inner surface 122 of the cavity C. In more detail, the reflective layer 500 may cover the inner surface 122 of the cavity C. Further, the reflective layer 500 may be directly provided on the inner surface 122 of the cavity C. The reflective layer 500 may be coated on the inner surface 122 of the cavity C.

The reflective layer 500 may be formed on the entire portion of the inner surface 122 of the cavity C. In more detail, the reflective layer 500 may be provided on all of four inner surfaces of the cavity C. Therefore, the reflective layer 500 may surround the light emitting part 300, the filling part 400, and the light conversion layer 600. The reflective layer 500 may be formed on the bottom surface of the cavity C.

The reflective layer 500 may include a material representing high reflectance. For example, the reflective layer 500 may include white PSR (photo solder resist) ink, silver (Ag), or aluminum (Al).

The light conversion layer 600 is provided in the cavity C. The light conversion layer 600 is provided adjacent to the reflective layer 500. The light conversion layer 600 may directly make contact with the reflective layer 500. In more detail, the light conversion layer 600 may be provided on a reflective surface 510 of the reflective layer 500. The light conversion layer 600 may cover the reflective layer 500. The light conversion layer 600 may be formed on the entire portion of the reflective surface of the reflective layer 500. The light conversion layer 600 may surround the light emitting part 300 and the filling part 400. In other words, the light conversion layer 600 may surround a peripheral portion of the light emitting part 300. In other words, the internal width of the light conversion layer 600 may be increased as the light conversion layer 600 is farther away from the light emitting part 300. In other words, the light conversion layer 600 may have a radiation structure. In addition, the reflective layer 500 and the light conversion layer 600 may be inclined with respect to an optical axis OA of the light emitting part 600.

The light conversion layer 600 is spaced apart from the light emitting part 300. Further, the light conversion layer 600 is spaced apart from the light emitting part 300, and the filling part 400 is provided between the light conversion layer 600 and the light emitting part 300. In addition, the light conversion layer 600 may directly make contact with the filling part 400.

In addition, the light conversion layer 600 is spaced apart from the light emitting part 300, and provided between the light conversion part 300 and the inner surface 122 of the cavity C. In addition, the reflective layer 500 is provided between the light conversion layer 600 and the inner surface 122 of the cavity C.

The light conversion layer 600 may be coated on the reflective surface 510 of the reflective layer 500. The thickness of the light conversion layer 600 may be in the range of about 0.5 µm to about 100 µm. In more detail, the thickness of the light conversion layer 600 may be in the range of about 1 µm to about 10 µm.

The light conversion layer 600 receives the light from the light emitting part 300 to convert the wavelength of the light. For instance, the light conversion layer 600 may convert the incident blue light into the green light and the red light. In detail, the light conversion layer 600 may convert a part of the blue light into the green light having the wavelength in the range of about 520 nm to about 560 nm, and another part of the blue light into the red light having the wavelength in the range of about 630 nm to about 660 nm.

In addition, the light conversion layer 600 may convert the UV light emitted from the light emitting part 300 into the blue light, the green light and the red light. In detail, the light conversion layer 600 may convert a part of the UV light into the blue light having the wavelength in the range of about 430 nm to about 470 nm, another part of the UV light into the green light having the wavelength in the range of about 520 nm to about 560 nm, and a part of the UV light into the red light having the wavelength in the range of about 630 nm to about 660 nm.

Therefore, the white light can be generated by the light passing through the light conversion layer 600 and the lights converted by the light conversion layer 600. In detail, the light emitting diode can output the white light through the combination of the blue, green, and red lights.

The light conversion layer 600 includes a plurality of light conversion particles 610 and a host layer 620.

The light conversion particles 610 are provided in the cavity C. In more detail, the light conversion particles 610 are uniformly distributed in the host layer 620, and the host layer 620 is provided in the cavity C.

The light conversion particles 610 convert the wavelength of light emitted from the light emitting part 300. The light conversion particles 610 receive the light emitted from the light emitting part 300 and convert the wavelength of the light. For example, the light conversion particles 610 convert the blue light from the light emitting part 300 into the green light or the red light. In other words, a part of the light conversion particles 610 may convert the blue light into the green light having the wavelength in the range of about 520 nm to about 560 nm, and a part of the light conversion particles 610 may convert the blue light into the red light having the wavelength in the range of about 630 nm to about 660 nm.

Alternatively, the light conversion particles 610 can convert the UV light emitted from the light emitting chip 300 into the blue light, the green light and the red light. In other words, a part of the light conversion particles 610 converts the UV light into the blue light having the wavelength in the range of about 430 nm to about 470 nm, and another part of the light conversion particles 610 converts the UV light into the green light having the wavelength in the range of about 520 nm to about 560 nm. Further, a part of the light conversion particles 420 converts the UV light into the red light having the wavelength in the range of about 630 nm to about 660 nm.

In other words, if the light emitting part 300 emits blue light, the light conversion particles 610 to convert the blue light into green and red lights may be used. In addition, if the light emitting part 300 emits UV light, the light conversion particles to convert the UV light into blue, green, and red lights may be used.

The light conversion particles 610 may include a plurality of quantum dots. The quantum dots may include core nano-crystals and shell nano-crystals surrounding the core nano-crystals. In addition, the quantum dots may include organic ligands bonded with the shell nano-crystals. Further, the quantum dots may include organic coating layers surrounding the shell nano-crystals.

The shell nano-crystals may be prepared at least two layers. The shell nano-crystals are formed on the surface of the core nano-crystals. The quantum dots can lengthen the wavelength of the light incident into the core nano-crystals by using the shell nano-crystals forming a shell layer, thereby improving the light efficiency.

The quantum dots may include at least one of a group-II compound semiconductor, a group-III compound semiconductor, a group-V compound semiconductor, and a group-VI compound semiconductor. In more detail, the core nano-crystals may include CdSe, InGaP, CdTe, CdS, ZnSe, ZnTe, ZnS, HgTe or HgS. In addition, the shell nano-crystals may include CuZnS, CdSe, CdTe, CdS, ZnSe, ZnTe, ZnS, HgTe or HgS. The diameter of the quantum dot may be in the range of 1 nm to 10 nm.

The wavelength of the light emitted from the quantum dots can be adjusted according to the size of the quantum dot or the molar ratio between the molecular cluster compound and the nano-particle precursor in the synthesis process. The organic ligand may include pyridine, mercapto alcohol, thiol, phosphine and phosphine oxide. The organic ligand may stabilize the unstable quantum dots after the synthesis process. Dangling bonds may be formed at the valence band and the quantum dots may be unstable due to the dangling bonds. However, since one end of the organic ligand is the non-bonding state, one end of the organic ligand is bonded with the dangling bonds, thereby stabilizing the quantum dots.

In particular, if the size of the quantum dot is smaller than the Bohr radius of an exciton, which consists of an electron and a hole excited by light and electricity, the quantum confinement effect may occur, so that the quantum dot may have the discrete energy level. Thus, the size of the energy gap is changed. In addition, the charges are confined within the quantum dot, so that the light emitting efficiency can be improved.

Different from general phosphorous pigments, the fluorescent wavelength of the quantum dot may vary depending on the size of the particles. In detail, the light has the shorter wavelength as the size of the particle is reduced, so that the phosphorous light having the wavelength band of visible ray can be generated by adjusting the size of the particles. In addition, the quantum dot represents the extinction coefficient which is 100 to 1000 times higher than that of the general phosphorous pigment and has the superior quantum yield as compared with the general fluorescent pigment, so that strong fluorescent light can be generated.

The quantum dots can be synthesized through the chemical wet scheme. The chemical wet scheme is to grow the particles by immersing the precursor material in the organic solvent. According to the chemical wet scheme, the quantum dots can be synthesized.

The host layer 620 is provided on the reflective layer 500. The host layer 620 may be coated on the entire portion of the reflective surface 510 of the reflective layer 500. The host layer 620 may adhere to the reflective layer 500.

The host layer 620 surrounds the light conversion particles 610. In other words, the host layer 620 uniformly distributes the light conversion particles 610 therein. The host layer 620 may include polymer. The host layer 620 is transparent. The host layer 620 may include transparent polymer.

The host layer 620 may include a thermosetting resin or a photo-curable resin. The host layer 620 may include silicon-based resin or epoxy-based resin.

As described above, according to the light emitting diode package of the embodiment, the reflective layer 500 is provided adjacent to the light conversion layer 600. Accordingly, after the wavelength of the light emitted from the light emitting part 300 has been incident into the light conversion layer 600, the wavelength of the light may be instantly converted. In addition, the wavelength of the light emitted from the light emitting part 300 may be converted after the light has passed through the light conversion layer 600, reflected by the reflective layer 500, and re-incident into the light absorbing layer.

As described above, according to the light emitting diode package according to the first embodiment, the wavelength of the light emitted from the light emitting part 300 can be effectively converted by forming the light conversion layer 600 on the reflective layer 500.

Therefore, according to the light emitting diode package of the first embodiment, improved light conversion efficiency can be represented, and improved color reproducibility can be represented.

In addition, the light conversion layer 600 may be formed on a region adjacent to the reflective layer 500, for example, only on the reflective surface 510 of the reflective layer 500 without forming on the internal entire portion of the cavity C. Therefore, according to the light emitting diode package of the first embodiment, the use of the light conversion particles 610 such as quantum dots used in the light conversion layer 600 may be reduced. Therefore, the light emitting diode package according to the first embodiment may be easily fabricated at a low cost In addition, the light conversion layer 600 is formed on the inner surface 122 of the cavity C while being spaced apart from the light emitting part 300. Therefore, the light conversion layer 600 may be prevented from being degraded due to heat emitted from the light emitting part 300. Accordingly, the light emitting diode package according to the first embodiment may represent improved reliability and improved durability.

Referring to FIGS. 4 and 5, the light emitting diode package according to the first embodiment further includes a reflective part 700. The reflective part 700 is provided adjacent to the optical axis OA of the light emitting part 300. In more detail, the reflective part 700 is provided adjacent to the optical axis OA of the light emitting part 300. In addition, the reflective part 700 may be provided in the cavity C. In more detail, the reflective part 700 may be provided in the filling part 400. The reflective part 700 may be integrally formed with the filling part 400.

The reflective part 700 may include a material representing high reflectance. In more detail, the reflective part 700 may include representing reflectance very higher than that of the material constituting the filling part 400. In addition, the reflective part 700 may include white PSR (photo solder resist) ink, silver (Ag), or aluminum (Al).

The reflective part 700 reflects light emitted from the light emitting part 300. In more detail, the reflective part 700 may reflect light emitted from the light emitting part 300 in a side direction. In more detail, the reflective part 700 may reflect the light emitted from the light emitting part 300 to the light conversion part 600.

As shown in FIG. 4, the reflective part 700 may have the shape of a plate. In addition, the center of the reflective part 700 may be provided on the optical axis OA of the light emitting part 300.

As shown in FIG. 5, the reflective part 700 may have a conical shape. In this case, the vertex of the reflective part 700 is directed toward the light emitting part 300. In addition, the vertex of the reflective part 700 may be provided on the optical axis OA of the light emitting part 300. In addition, the vertex of the reflective part 700 is directed toward the light emitting part 300.

Referring to FIG. 6, a recess part 401 may be formed in the filling part 400. The recess part 401 may be recessed toward the light emitting part 300. Therefore, an inner surface 401 of the recess part 401 may serve as a total reflection surface 510. In other words, the inner surface 410 of the recess part 401 is inclined with respect to the optical axis OA of the light emitting part 300. In addition, the light emitted from the light emitting part 300 toward the recess part 401 may be reflected in the side direction due to the inner surface 410 of the recess part 401.

As described above, the reflective part 700 and the recess part 401 reflect light emitted from the light emitting part 300 toward the light conversion layer 600. Accordingly, the greater amount of light can be incident into the light conversion layer 600 by the reflective part 700 and the recess part 401.

Accordingly, the light emitting package according to the first embodiment may represent improved color reproducibility.

Hereinafter, the light emitting device package according to the second embodiment will be described with reference to FIGS. 7 to 16.

Figure 7:
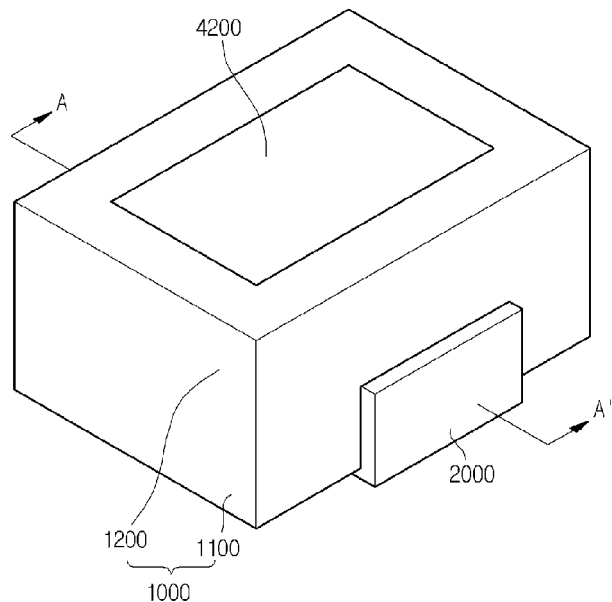
FIG. 7 is a perspective view showing a light emitting device package according to the second embodiment.
Figure 8:
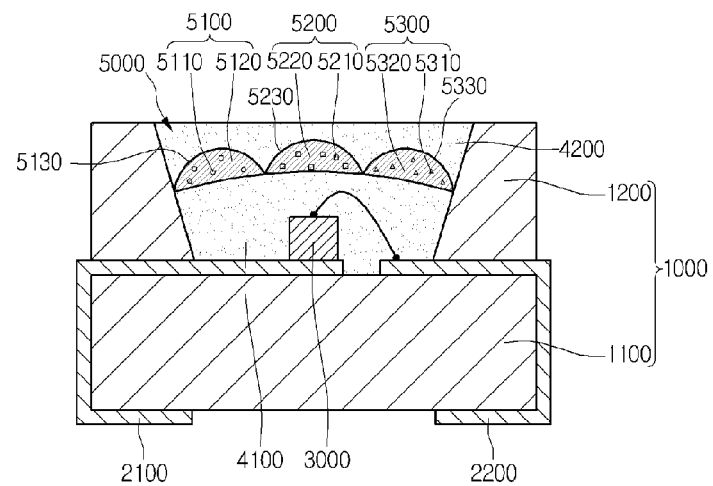
FIG. 8 is a sectional view taken along line A-A' of FIG. 7.
Figure 13:
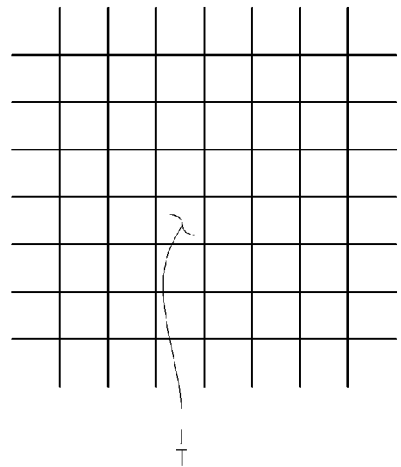
FIG. 13 is a plan view showing a heat transfer part.
Figure 14:
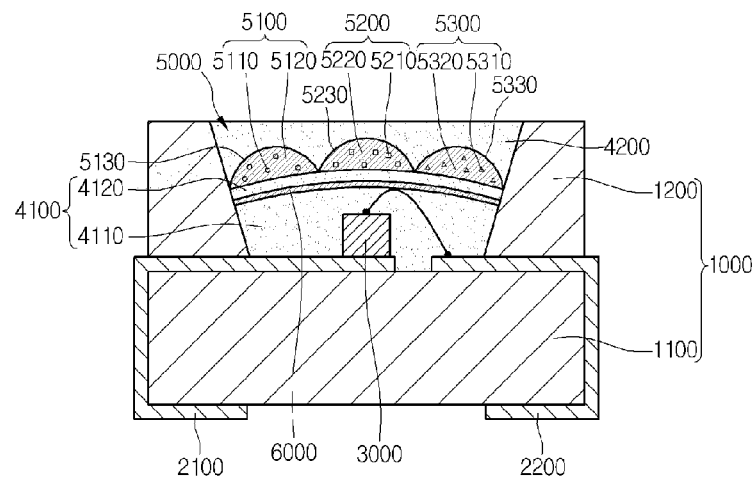
FIG. 14 is a sectional view showing a light emitting device package according to another modification of the second embodiment.
Figure 15:
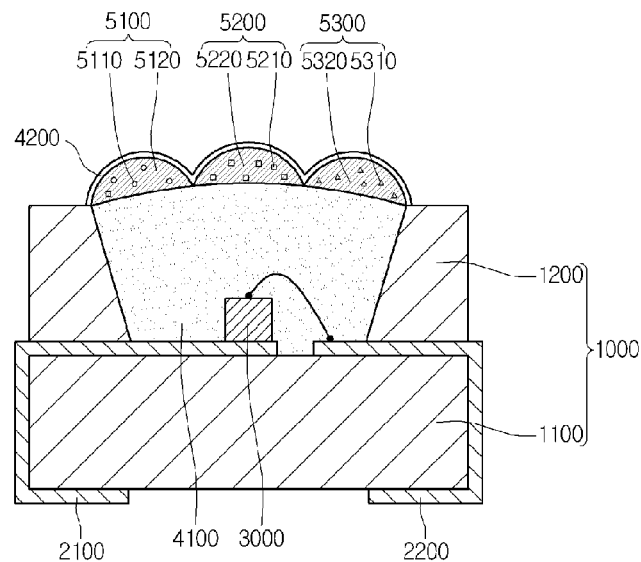
FIG. 15 is a sectional view showing a light emitting device package according to still another modification of the second embodiment.
Figure 16:
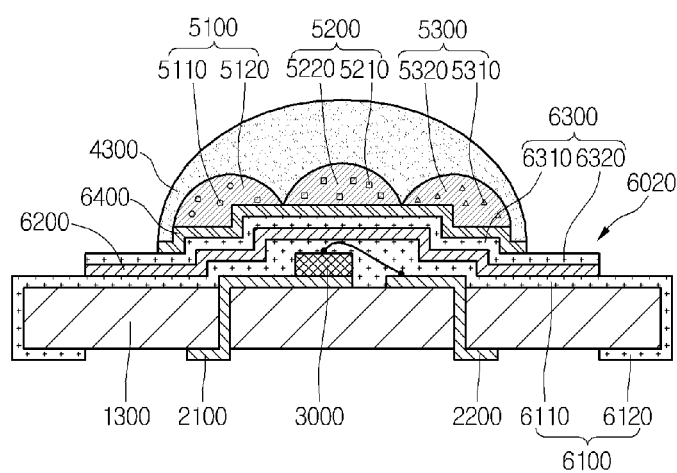
FIG. 16 is a sectional view showing a light emitting device package according to still another modification of the second embodiment.

FIG. 7 is a perspective view showing a light emitting device package according to the second embodiment, FIG. 8 is a sectional view taken along lien A-A' of FIG. 7, and FIGS. 9 to 11 are plan views showing a light conversion part. FIG. 13 is a plan view showing a heat transfer part, FIG. 14 is a sectional view showing a light emitting device package according to another embodiment, and FIG. 15 is a sectional view showing a light emitting device package according still another embodiment. FIG. 16 is a sectional view showing a light emitting device package according to still another embodiment.

Referring to FIGS. 7 to 11, the light emitting device package according to the embodiment includes a body 1000, a plurality of lead electrodes 2100 and 2200, a light emitting part 3000, a first capping part 4100, a light conversion part 5000, and a second capping part 4200.

The body 1000 receives the light emitting part 3000, the filling part 4000, a reflective layer, and the light conversion part 5000 and supports the lead electrodes 2100 and 2200.

The body 1000 may include any one among a resin material such as PPA, a ceramic material, a liquid crystal polymer (LCP), SPS(Syndiotactic), PPS (Poly(phenylene ether)), and a silicon material. However, the embodiment is not limited thereto. The body 1000 may have an integral structure through an injection molding scheme, or a stack structure including a plurality of layers.

The body 1000 includes a cavity C having an open upper portion. The cavity C may be formed by performing a patterning, punching, cutting, or etching process with respect to the body 1000. In addition, the cavity C may be formed by using a metallic frame having the shape of the cavity C when the body 1000 is molded.

The shape of the cavity C may include a cup shape, or a concave container shape. The surface of the cavity C may have a circular shape, a polygonal shape, or a random shape, but the embodiment is not limited thereto.

An inner surface of the cavity C may be perpendicular to a bottom surface of the cavity C or inclined with respect to the bottom surface of the cavity C based on the light emission angle of the light emitting diode package.

The body 1000 includes a base part 1100 and a receiving part 1200.

The base part 1100 supports the receiving part 1200. In addition, the base part 1100 supports the lead electrodes 2100 and 2200. For example, the base part 1100 may have a rectangular shape.

The receiving part 1200 is provided on the base part 1200. The cavity C is defined by the receiving part 1200. In other words, the cavity C is a groove formed in the receiving part 1200. The receiving part 1200 surrounds the peripheral portion of the cavity C. The receiving part 1200 may have the shape of a closed loop when viewed from the top. For example, the receiving part 1200 may have the shape of a wall surrounding the cavity C.

The receiving part 1200 includes a top surface, an outer surface, and an inner surface. The inner surface is inclined with respect to the top surface.

The lead electrodes 2100 and 2200 may be realized by using lead frames, but the embodiment is not limited thereto.

The lead electrodes 2100 and 2200 are provided in the body 1000. The lead electrodes 2100 and 2200 are electrically insulated from each other on the bottom surface of the cavity C. The outer portions of the lead electrodes 2100 and 2200 may be exposed outside the body 100.

The end portions of the lead electrodes 2100 and 220 may be provided at one side of the cavity C or an opposite side of the cavity C.

The lead electrodes 2100 and 2200 may include lead frames. The lead frames may be formed when performing the injection-molding with respect to the body 100. For example, the lead electrodes 2100 and 2200 may include the first lead electrode 2100 and the second electrode 2200.

The first and second lead electrodes 2100 and 2200 are spaced apart from each other. The first and second lead electrodes 2100 and 2200 are electrically connected to the light emitting part 3000.

The light emitting part 3000 includes at least one light emitting diode chip. For example, the light emitting part 3000 may include a color light emitting diode chip or an UV light emitting diode chip.

The light emitting part 3000 may include a horizontal light emitting diode chip or a vertical light emitting diode chip. As shown in FIG. 3, the light emitting part 3000 may include a conductive substrate 310, a light reflective layer 320, a first conductive semiconductor layer 330, a second conductive semiconductor layer 340, an active layer 350, and a second electrode 360. In other words, the description of the light emitting part provided in the light emitting device package according to the second embodiment will be incorporated in the description of the light emitting part of the light emitting device package according to the first embodiment.

The light emitting part 3000 may be connected to the first lead electrode 2100 through a bump. The light emitting part 3000 may be connected to the second lead electrode 2200 through a wire. In particular, the light emitting part 3000 may be directly provided on the first lead electrode 2100.

In addition, the light emitting part 3000 may be connected to the lead electrodes through various connection schemes such as a wire bonding scheme, a die bonding scheme, or a flip-bonding scheme without the above connection scheme. However, the embodiment is not limited thereto.

In addition, the reflective layer may be provided in the cavity C. The reflective layer may be provided on the inner surface of the cavity C. In more detail, the reflective layer may be coated on the inner surface of the cavity C. The reflective layer may include a material representing high reflectance. For example, the reflective layer may include white PSR ink, silver (Ag), or aluminum (Al).

The first capping part 4100 is provided in the cavity C. The first capping part 4100 covers the light emitting part 3000. The first capping part 4100 is provided on the bottom surface of the cavity C. In addition, the first capping part 4100 covers the top surface and the lateral side of the light emitting part 3000. The first capping part 4100 covers a portion of the lead electrodes 2100 and 2200.

The first capping part 4100 may include a curved surface. In more detail, the top surface of the first capping part 4100 directed toward the open upper portion of the cavity C may include a curved surface. In more detail, the top surface of the first capping part 4100 may include a curved surface that is totally convex.

The first capping part 4100 may seal the light emitting part 3000. The first capping part 4100 may protect the light emitting part 3000. The first capping part 4100 is transparent. The first capping part 4100 may include a material representing the refractive index of 2 or less. The first capping part 4100 may include silicon-based resin, or epoxy-based resin.

The first capping part 4100 serves as a spacer to space the light conversion part 5000 apart from the light emitting part 3000. In addition, the first capping part 4100 is interposed between the light emitting part 3000 and the light conversion part 5000 to perform an adiabatic function. In other words, the first capping part 4100 may include a material representing lower thermal conductivity. For example, the first capping part 4100 may have thermal conductivity lower than that of the second capping part 4200. Accordingly, the heat emitted from the light emitting part 3000 may be efficiently blocked by the first capping part 4100.

The light conversion part 5000 is provided in the cavity C. The light conversion part 5000 is provided on the path of the light emitted from the light emitting part 3000. The light conversion part 5000 is provided on the light emitting part 3000. The light conversion part 5000 is provided on at least one surface of the first capping part 4100. The light conversion part 5000 is provided on the top surface of the first capping part 4100. In other words, the light conversion part 5000 may be provided on the curved surface of the first capping part 4100. In more detail, the light conversion part 5000 may be directly provided on the curved surface of the first capping part 4100.

The light conversion part 5000 receives light emitted from the light emitting part 3000 to convert the wavelength of the light. For instance, the light conversion part 5000 can convert the incident blue light into the green light and the red light. That is, the light conversion part 5000 converts a part of the blue light into the green light having the wavelength in the range of about 520 nm to about 560 nm and converts another part of the blue light into the red light having the wavelength in the range of about 630 nm to about 660 nm. In addition, the light conversion part 5000 may convert the incident blue light into yellow, green, and red light.

In addition, the light conversion part 5000 may convert UV light emitted from the light emitting part 3000 into blue, green, and red light. In other words, the light conversion part 5000 converts a part of the UV light into the blue light having the wavelength in the range of about 430 nm to about 470 nm, converts another part of the UV light into the green light having the wavelength in the range of about 520 nm to about 560 nm, and another part of the UV light into the red light having the wavelength in the range of about 630 nm to about 660 nm.

Accordingly, the white light can be generated by the light converted by the light conversion part 5000 or the light passing through the light conversion part 5000. In other words, the white light can be emitted through the combination of the blue, green, and red lights.

Figure 9:
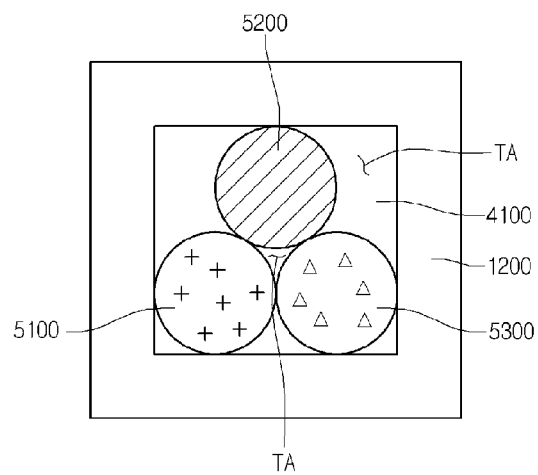
FIGS. 9 to 11 are plan views showing a light conversion part.

As shown in FIGS. 8 and 9, the light conversion part 5000 includes a plurality of light conversion lens parts 5100, 5200, and 5300. In more detail, the light conversion part 5000 may include the first light conversion lens part 5100, the second light conversion lens part 5200, and the third light conversion lens part 5300.

The first light conversion lens part 5100 is provided on the first capping part 4100. The first light conversion lens part 5100 is provided on the top surface of the first capping part 4100. In more detail, the first light conversion lens part 5100 may be provided on the curved surface of the first capping part 4100.

The first light conversion lens part 5100 has a curved surface 5130. In more detail, the first light conversion lens part 5100 may have a curved surface 5130 which is convex toward the open part, that is, upward. The curved surface 5130 of the first light conversion lens part 5100 may include a spherical surface or an aspherical surface. In addition, the first light conversion lens part 5100 may include a concave surface. In other words, the first light conversion lens part 5100 may include a surface which is concave toward the light emitting part 3000.

The first light conversion lens part 5100 may convert the light emitted from the light emitting part 3000 into the light having the first wavelength band. For example, the first light conversion lens part 5100 may convert incident light into green light. In more detail, the first light conversion lens part 5100 may convert the UV light or the blue light emitted from the light emitting part 3000 into green light having the wavelength band in the range of about 520 nm to about 560 nm.

The first light conversion lens part 5100 includes a plurality of first light conversion particles 5110 and a first matrix 5120.

The first light conversion particles 5110 may convert the UV light or the blue light emitted from the light emitting part 3000 into green light having the wavelength band. In other words, the first light conversion particles 5110 may convert the UV light or the blue light into green light having the wavelength band in the range of about 520 nm to about 560 nm.

The first light conversion particles 5110 may include a plurality of quantum dots. The quantum dots may include core nano-crystals and shell nano-crystals surrounding the core nano-crystals. In addition, the quantum dots may include organic ligands bonded to the shell nano-crystals. Further, the quantum dots may include an organic coating layer surrounding the shell nano-crystals.

The shell nano-crystals can be prepared as at least two layers. The shell nano-crystals are formed on the surface of the core nano-crystals. The quantum dots lengthen the wavelength of the light incident into the core nano-crystals by using the shell nano-crystals forming a shell layer, thereby improving the light efficiency.

The quantum dots may include at least one of a group-II compound semiconductor, a group-III compound semiconductor, a group-V compound semiconductor, and a group-VI compound semiconductor. In more detail, the core nano-crystals may include CdSe, InGaP, CdTe, CdS, ZnSe, ZnTe, ZnS, HgTe or HgS. In addition, the shell nano-crystals may include CuZnS, CdSe, CdTe, CdS, ZnSe, ZnTe, ZnS, HgTe or HgS. The quantum dot may have a diameter of about 1 nm to about 10 nm.

The wavelength of the light emitted from the quantum dots can be adjusted according to the size of the quantum dot or the molar ratio between the molecular cluster compound and the nano-particle precursor in the synthesis process. The organic ligand may include pyridine, mercapto alcohol, thiol, phosphine and phosphine oxide. The organic ligand may stabilize the unstable quantum dots after the synthesis process. Dangling bonds may be formed at the valence band and the quantum dots may be unstable due to the dangling bonds. However, since one end of the organic ligand is the non-bonding state, one end of the organic ligand is bonded with the dangling bonds, thereby stabilizing the quantum dots.

In particular, if the size of the quantum dot is smaller than the Bohr radius of an exciton, which consists of an electron and a hole excited by light and electricity, the quantum confinement effect may occur, so that the quantum dot may have the discrete energy level. Thus, the size of the energy gap is changed. In addition, the charges are confined within the quantum dot, so that the light emitting efficiency can be improved.

Different from general fluorescent pigments, the fluorescent wavelength of the quantum dot may vary depending on the size of the particles. In detail, the light has the shorter wavelength as the size of the particle becomes small, so the fluorescent light having the wavelength band of visible ray can be generated by adjusting the size of the particles. In addition, the quantum dot represents the extinction coefficient higher than that of the general fluorescent pigment by 100 to 1000 times and has the superior quantum yield, so that strong fluorescent light can be generated.

The quantum dots can be synthesized through the chemical wet scheme. According to the chemical wet scheme, the particles are grown by immersing the precursor material in the organic solvent. The quantum dots can be synthesized through the chemical wet scheme.

In addition, the first light conversion particles 5110 may include green phosphors. In more detail, the green phosphors may include zinc silicon oxide phosphors doped with Mn (e.g., $Zn_2SiO_4$:Mn), strontium gallium sulfide phosphors doped with europium (e.g., $SrGa_2S_4$:Eu), or barium silicon oxide chloride phosphors doped with europium (e.g., $Ba_5Si_2O_7Cl_4$:Eu).

The first matrix 5120 receives the first light conversion particles 5110. The first matrix 5120 surrounds the first light conversion particles 5110. The first matrix 5120 distributes the first light conversion particles 5110.

The first matrix 5120 is transparent. The first matrix 5120 may have a lens shape. The outer shape of the first light conversion lens part 5100 may be realized by the first matrix 5120. The first matrix 5120 may include silicon-based resin or epoxy-based resin.

The second light conversion lens part 5200 is provided on the first capping part 4100. The second light conversion lens part 5200 is provided on the top surface of the first capping part 4100. In more detail, the second light conversion lens part 5200 may be provided on the curved surface of the first capping part 4100.

In addition, the second light conversion lens part 5200 is provided beside the first light conversion lens part 5100. In other words, the first and second light conversion lens parts 5100 and 5200 may be provided on the same plane and may be adjacent to each other.

The second light conversion lens part 5200 has a curved surface 5230. In more detail, the second light conversion lens part 5200 may have a curved surface 5230 which is convex toward the open part, that is, upward. The curved surface 5230 of the second light conversion lens part 5200 may include a spherical surface or an aspherical surface. In addition, the second light conversion lens part 5200 may include a concave surface. In other words, the second light conversion lens part 5200 may include a surface which is concave toward the light emitting part 3000.

The second light conversion lens part 5200 may convert the light emitted from the light emitting part 3000 into light having a second wavelength band. For example, the second light conversion lens part 5200 may convert the incident light into red light. In more detail, the second light conversion lens part 5200 may convert the UV light or the blue light emitted from the light emitting part 3000 into red light having the wavelength band of about 630 nm to about 660 nm.

The second light conversion lens part 5200 includes a plurality of second light conversion particles 5210 and a second matrix 5220.

For example, the second light conversion particles 5210 may convert the blue light or UV light emitted from the light emitting part 3000 into red light. In other words, the second light conversion particles 5210 may convert the UV light or the blue light into the red light having the wavelength band of about 630 nm to about 660 nm.

The second light conversion particles 5210 may include a plurality of red quantum dots. The quantum dots used as the second light conversion particles 5210 may have the diameter of about 4 nm to about 10 nm so that the incident light into red light.

In addition, the second light conversion particles 5210 may include red phosphors. In more detail, the red phosphors may include strontium titanium oxide phosphors doped with praseodymium (e.g., $SrTiO_3$:Pr, Al) or calcium titanium oxide phosphors (e.g., $CaTiO_3$:Pr) doped with praseodymium.

The second matrix 5220 receives the second light conversion particles 521. The second matrix 5220 surrounds the second light conversion particles 521. The second matrix 5220 disperses the second light conversion particles 5210.

The second matrix 5220 is transparent. The second matrix 5220 may have a lens shape. The outer shape of the second light conversion lens part 5200 may be realized by the second matrix 5220. The second matrix 5220 may include silicon-based resin or epoxy-based resin.

The third light conversion lens part 5300 is provided on the first capping part 4100. The third light conversion lens part 5300 is provided on the top surface of the first capping part 4100. In more detail, the third light conversion lens part 5300 may be provided on the curved surface of the first capping part 4100.

In addition, the third light conversion lens part 5300 is provided beside the first light conversion part 5100. In addition, the third light conversion lens part 5300 is provided beside the second light conversion lens part 5200. In other words, the first to third light conversion lens parts 5100 to 5300 may be provided on the same plane, and may be adjacent to each other.

The third light conversion lens part 5300 has a curved surface 5330. In more detail, the third light conversion lens part 5300 may have a curved surface 5330 which is convex toward the open part, that is, upward. The curved surface 5330 of the third light conversion lens part 5300 may include a spherical surface or an aspherical surface. In addition, the third light conversion lens part 5300 may include a concave surface. In other words, the third light conversion lens part 5300 may include a surface which is concave toward the light emitting part 3000.

The third light conversion lens part 5300 may convert light emitted from the light emitting part 3000 to light having a third wavelength band. For example, if the UV light is emitted from the light emitting part 3000, the third light conversion lens part 5300 may convert the UV light into blue light. In more detail, the third light conversion lens part 5300 may convert the UV light emitted from the light emitting part 3000 into the blue light having the wavelength band in the range of about 430 nm to about 470 nm.

In addition, the third light conversion lens part 5300 may convert the blue light emitted from the light emitting part 3000 into yellow light.

The third light conversion lens part 5300 includes a plurality of third light conversion particles 5310 and a third matrix 5320.

The third light conversion particles 5310 may convert the UV light emitted from the light emitting part 3000 into blue light. In other words, the third light conversion particles 5310 may convert the UV light into the blue light having the wavelength band in the range of about 430 nm to about 470 nm.

The third light conversion particles 5310 may include a plurality of red quantum dots. The quantum dots used as the third light conversion particles 5310 may have the diameter of about 1 nm to about 2 nm so that the incident light into blue light.

In addition, the third light conversion particles 5310 may include a blue phosphor.

Alternatively, if the light emitting part 3000 emits the blue light, the third light conversion particles 5310 may convert the blue light emitted from the light emitting part 3000 into yellow light. In this case, the third light conversion particles 5310 may include a yellow phosphor such as a YAG phosphor.

The third matrix 5320 receives the third light conversion particles 5310. The third matrix 5320 surrounds the third light conversion particles 5310. The third matrix 5320 distributes the third light conversion particles 5310.

The third matrix 5320 is transparent. The second matrix 5320 may have a lens shape. The outer shape of the third light conversion lens part 5300 may be realized by the third matrix 5320. The third matrix 5320 may include silicon-based resin or epoxy-based resin.

In addition, as shown in FIG. 9, transmissive regions TA may be formed between the first and second light conversion lens parts 5100 and 5200, and between the second and third light conversion lens parts 5200 and 5300. In other words, the transmissive regions TAs allow the light emitted from the light emitting part 3000 to directly pass therethrough without being converted. The color coordinates of the light emitting device according to the embodiment can be properly adjusted by adjusting the area of the transmissive regions TA. In addition, the transmissive regions TAs may be defined in peripheral regions of the first to third light conversion lens parts 5100 to 5300.

The first to third light conversion lens parts 5100 to 5300 emit lights having wavelength bands different from each other. In addition, the first to third light conversion lens parts 5100 to 5300 may be differently designed.

Therefore, the first to third light conversion lens parts 5100 to 5300 may be designed so that the optical characteristics of the first to third light conversion lens parts 5100 to 5300 are suitable to lights of the wavelength bands thereof, respectively.

In other words, the sizes, the shapes, and the refractive indexes of the first to third light conversion lens parts 5100 to 5300 may be adjusted suitably for the lights of the wavelength bands thereof.

For example, the light conversion lens part emitting the light having a longer wavelength band may be designed with a less orientation angle. The light conversion lens part emitting the light having a shorter wavelength band may be designed with a great orientation angle.

In other words, the sizes and the radiuses of curvature of the first to third light conversion part 5100 to 5300 and the concentration of the light conversion particles 5100, 5210, and 5310 can be properly adjusted. Accordingly, the light emitting device according to the embodiment may emit lights representing required characteristics according to the wavelength bands.

In addition, the light emitting device according to the embodiment can easily adjust the color coordinates by adjusting the sizes of the first to third light conversion lens parts 5100 to 5300.

Figure 10:
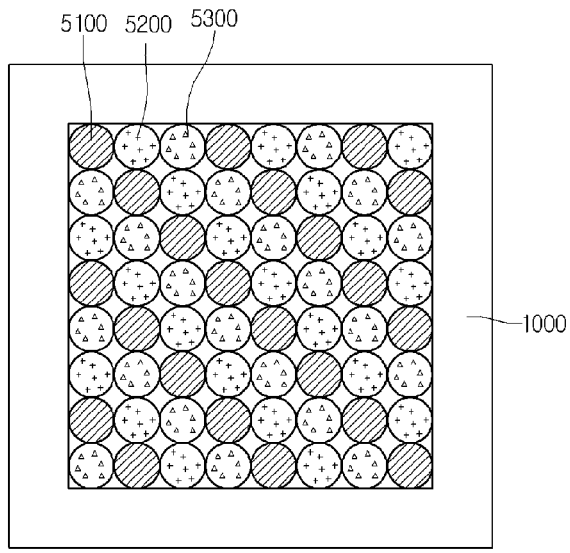
Figure 11:
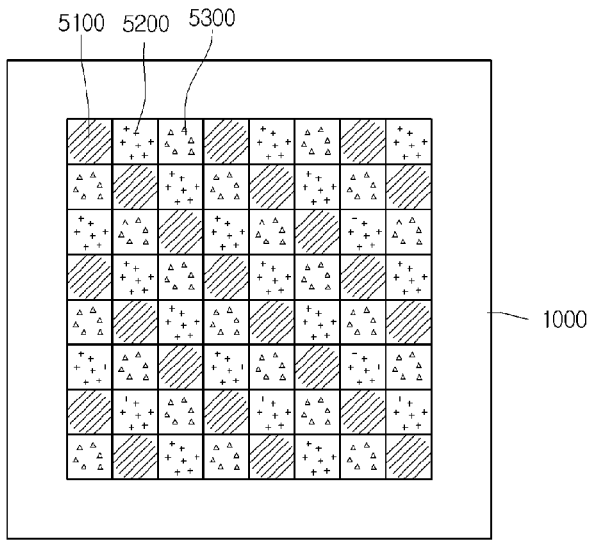

Referring to FIGS. 10 and 11, the first to third light conversion lens parts 5100 to 5300 may constitute a light conversion pattern. In other words, the light conversion part 5000 includes the light conversion pattern. In other words, the light conversion part 5000 may include the light conversion lens parts 5100 to 5300 that are uniformly repeated.

The light conversion pattern includes the light conversion lens parts 5100 to 5300 provided on the entire portion of the top surface of the first capping part 4100. As shown in FIG. 10, the light conversion lens parts 5100, 5200, and 5300 may have a circular shape. As shown in FIG. 11, the light conversion lens parts 5100 to 5300 may have a rectangular shape.

The light conversion lens parts 5100, 5200, and 5300 may include a plurality of first light conversion lens parts 5100, a plurality of second light conversion lens parts 5200, and a plurality of third light conversion lens parts 5300.

In this case, the first light conversion lens parts 5100 may emit green light, the second light conversion lens parts 5200 may emit red light, and the third light conversion lens parts 5300 may emit blue light or yellow light.

The first to third light conversion lens parts 5100 to 5300 may be alternately arranged. The first light conversion lens parts 5100 are provided at the center of the light conversion part 5000, and the second light conversion lens parts 5200 may be provided at the outer portions of the light conversion part 5000. In other words, the first light conversion lens parts 5100 are closer to the optical axis of the light emitting part 3000, and the second light conversion lens parts 5200 may be provided farther away from the optical axis of the light emitting part 3000.

Therefore, the light emitting device according to the embodiment can emit light having a required wavelength band at a required position from the optical axis of the light emitting part 3000. In other words, the light emitting device according to the embodiment can properly adjust the positions according to the required wavelength bands by using the light conversion pattern.

In addition, the first to third light conversion lens parts 5100 to 5300 may have a diameter of about 10 μm to about 1 mm.

The second capping part 4200 covers the light conversion part 5000. The second capping part 4200 is provided in the cavity C. The second capping part 4200 seals the light conversion part 5000. The second capping part 4200 covers the light conversion lens parts 5100 to 5300. The second capping part 4200 covers the curved surfaces of the light conversion lens parts 5100 to 5300. In more detail, the second capping part 4200 directly makes contact with the light conversion lens parts 5100 to 5300.

The second capping part 4200 is transparent. The second capping part 4200 may include an inorganic material. The second capping part 4200 may include silicon oxide or indium tin oxide.

The second capping part 4200 may have higher thermal conductivity. The second capping part 4200 may have thermal conductivity higher than that of the first capping part 4100. In addition, the second capping part 4200 may have thermal conductivity higher than that of the light conversion part 5000.

The light conversion lens parts 5100, 5200, and 5300 include convex curved surfaces 5130, 5230, and 5330. Therefore, the contact area between the light conversion lens parts 5100, 5200, and 5300 and the second capping part 4200 is increased, and the heat emitted from the light conversion lens parts 5100, 5200, and 5300 may be easily discharged through the second capping part 4200.

Accordingly, the light emitting device according to the embodiment can reduce the performance degradation caused by the heat, and can represent improved reliability and durability.

In addition, as described above, the light emitting device according to the embodiment can emit white light representing improved optical characteristics by using the light conversion lens parts 5100, 5200, and 5300.

Figure 12:
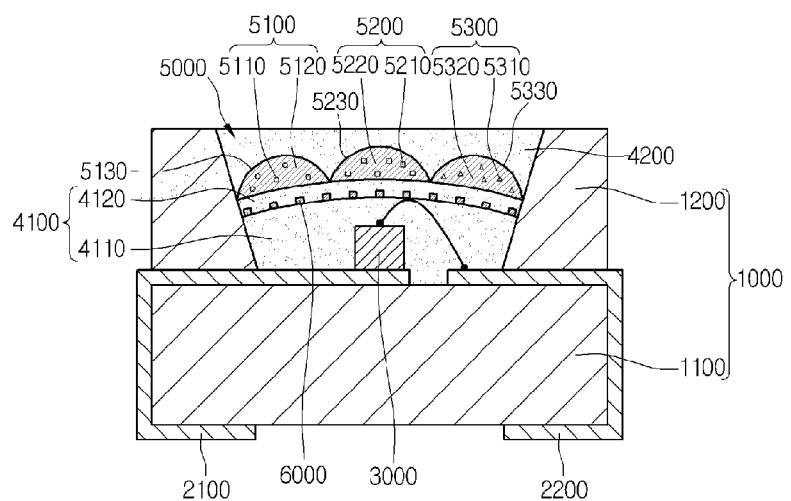
FIG. 12 is a sectional view showing a light emitting device package according to the modification of the second embodiment.

FIG. 12 is a sectional view showing a light emitting device package according to another embodiment. FIG. 13 is a plan view showing a heat transfer part. FIG. 14 is a sectional view showing a light emitting device package according to still another embodiment. Hereinafter, the present embodiments will be described by making reference to the above description of the light emitting device packages. In other words, the description of the light emitting device package may be incorporated in the description of the present embodiment except for the modifications.

Referring to FIGS. 12 to 14, the light emitting device package according to the present embodiment includes a heat transfer part 6000.

The heat transfer part 6000 is interposed between the light conversion part 5000 and the light emitting part 3000. The heat transfer part 6000 may represent high thermal conductivity. The heat transfer part 6000 is provided in the first capping part 4100. In this case, the heat transfer part 6000 is provided at the intermediate region of the first capping part 4100.

Therefore, the first capping part 4100 may be divided into a first adiabatic part 4110 and a second adiabatic part 4120. In other words, the heat transfer part 6000 may represent thermal conductivity higher than that of the first capping part 4100. In other words, the first and second adiabatic parts 4110 and 4120 represent thermal conductivity lower than that of the heat transfer part 6000. The first and second adiabatic parts 4110 and 4120 sandwich the heat transfer part 6000 therebetween.

The heat transfer part 6000 may include a material representing high thermal conductivity. The heat transfer part 6000 may include indium tin oxide, aluminum (Al), or silver (Ag) representing high reflectance. In this case, as shown in FIG. 12, the heat transfer part 6000 may have the shape of a mesh. In other words, the heat transfer part 6000 includes a transmissive part T allowing light to pass therethrough. In other words, the heat transfer part 6000 allows light to pass therethrough.

The heat transfer part 6000 is connected to the body 1000. In more detail, the heat transfer part 6000 is connected to a heat radiation member (not shown) provided in the body 1000. Therefore, the heat transfer part 6000 may effectively discharge heat emitted from the light emitting part 3000 to the outside.

In addition, the first and second heat radiation parts 4110 and 4120 are coupled with the heat transfer part 6000, so that the first and second heat radiation parts 4110 and 4120 can effectively block heat. In other words, the first adiabatic part 4110 can primarily block the heat emitted from the light emitting part 3000, and the second adiabatic part 4120 can effectively block remaining heat after the heat is discharged through the heat transfer part 6000.

In addition, as shown in FIG. 14, the heat transfer part 6000 may include a transparent layer. For example, the heat transfer part 6000 may include a transparent conductive layer. The heat transfer part 6000 may include indium tin oxide or zinc oxide doped with metal.

As described above, the light emitting diode package according to the embodiment can effectively block and discharge heat emitted from the light emitting part 3000, thereby preventing the light conversion part 5000 from being degraded.

Accordingly, the light emitting diode package according to the embodiment can represent improved reliability and durability.

FIG. 15 is a sectional view showing the light emitting device package according to still another embodiment. Hereinafter, the present embodiments will be described by making reference to the above description of the light emitting device packages. In other words, the description of the light emitting device package may be incorporated in the description of the present embodiment except for the modifications.

Referring to FIG. 15, the light conversion part 5000 may be provided outside the body 1000. In other words, the light conversion part 5000 may be provided outside the cavity C of the body 1000. In addition, the first capping part 4100 may be filled in the entire portion of the cavity C.

The light conversion lens parts 5100, 5200, and 5300 constituting the light conversion part 5000 is provided outside the cavity C. In addition, the second capping part 4200 may cover the light conversion lens parts 5100, 5200, and 5300 in the form of a thin film.

Therefore, the second capping part 4200 may have the same shape as that of the light conversion lens parts 5100, 5200, and 5300. In other words, the second capping part 4200 may have the same curved surface as that of the light conversion lens parts 5100, 5200, and 5300.

Therefore, the light emitting device package according to the present embodiment can freely adjust the optical characteristics of the light conversion lens parts 5100, 5200, and 5300 without the influence of the second capping part 4200.

In addition, since the light conversion part 5000 is provided outside the cavity C, the light conversion part 5000 may not be damaged due to the heat emitted from the light emitting part 3000.

Therefore, the light emitting device package according to the embodiment can represent improved reliability and improved durability.

FIG. 16 is a sectional view showing the light emitting device package according to still another embodiment. Hereinafter, the present embodiments will be described by making reference to the above description of the light emitting device packages. In other words, the description of the light emitting device package may be incorporated in the description of the present embodiment except for the modifications.

Referring to FIG. 16, the light emitting device package according to the present embodiment includes a substrate 1300, two lead electrodes 2100 and 2200, a light emitting part 3000, a heat radiation part 6020, light conversion parts 5100, 5200, and 5300, and a capping part 4300.

The substrate 1300 supports the lead electrodes 2100 and 2200, the light emitting part 3000, the heat radiation part 6020, the light conversion parts 5100, 5200, and 5300, and the capping part 4300. The substrate 1300 includes an insulator. The substrate 1300 may have the shape of a plate. The substrate 1300 may include a polymer substrate and a glass substrate. In more detail, the substrate 1300 may include epoxy resin.

The lead electrodes 2100 and 2200 may pass through the substrate 1300. The lead electrodes 2100 and 2200 may extend from the top surface of the substrate 1300 to the bottom surface thereof. The lead electrodes 2100 and 2200 and the substrate 1300 may be formed through an overmolding process.

The light emitting part 3000 is provided on the substrate 1300. The light emitting part 3000 is electrically connected to the lead electrodes 2100 and 2200.

The heat radiation part 6020 is provided on the substrate 1300. The heat radiation part 6020 covers the light emitting part 3000. The heat radiation part 6020 covers the lateral side and the top surface of the light emitting part 3000. The heat radiation part 6020 may directly make contact with the light emitting part 3000. The heat radiation part 6020 may directly make contact with the lead electrodes 2100 and 2200.

The heat radiation part 6020 discharges heat emitted from the light emitting part 3000 to the outside. In more detail, the heat radiation part 6020 may discharge the heat emitted from the light emitting part 3000 in a side direction.

The heat radiation part 6020 may be formed by laminating a plurality of thin films. In more detail, the heat radiation part 6020 may be formed by laminating thin films having thermal conductivities different from each other. The heat radiation part 6020 has a thickness of about 1 μm to about 1 mm.

The heat radiation part 6020 includes a first heat conductive layer 6100, a first adiabatic layer 6200, a second heat conductive layer 6300, and a second adiabatic layer 6400.

The first heat conductive layer 6100 is provided on the substrate 1300. The first heat conductive layer 6100 covers the light emitting part 3000. In addition, the first heat conductive layer 6100 covers the top surface of the substrate 1300. The first heat conductive layer 6100 covers the top surface and the lateral side of the light emitting part 3000. The first heat conductive layer 6100 may directly make contact with the light emitting part 3000. In addition, the first heat conductive layer 6100 may extend to the lateral side of the substrate 1300. In more detail, the first heat conductive layer 6100 may extend the lateral side and the bottom surface of the substrate 1300.

The first heat conductive layer 6100 has a thickness of about 1 μm to about 500 μm.

The first heat conductive layer 6100 includes a first heat transfer part 6110 and a first heat discharge part 6120.

The first heat transfer part 6110 is covered by the first adiabatic layer 6200. In other words, the first heat transfer part 6110 corresponds to the first adiabatic layer 6200. The first heat transfer part 6110 directly makes contact with the first adiabatic layer 6200.

The first heat discharge part 6120 is exposed by the first adiabatic layer 6200. The first heat discharge part 6120 is integrally formed with the first heat transfer part 6110. The first heat discharge part 6120 may be exposed to the air.

The heat emitted from the heat radiation part 6020 is transferred to the first heat discharge part 6120 through the first heat transfer part 6110. The first heat discharge part 6120 may discharge the heat transferred from the first heat transfer part 6110 to the air.

The first adiabatic layer 6200 is provided on the first heat conductive layer 6100. The first adiabatic layer 6200 covers a part of the top surface of the first heat conductive layer 6100. The first adiabatic layer 6200 is directly provided on the top surface of the first heat conductive layer 6100. The first adiabatic layer 6200 exposes a portion of the first heat conductive layer 6100. In other words, the first adiabatic layer 6200 covers the first heat conductive layer 6100 while exposing the first heat discharge part 6120.

The first adiabatic layer 6200 may have a thickness of about 1 μm to about 500 μm.

The second heat conductive layer 6300 is provided on the first adiabatic layer 6200. The third heat conductive layer 6300 covers the top surface of the first adiabatic layer 6200. The second heat conductive layer 6300 may directly make contact with the first adiabatic layer 6200.

The second thermal conductive layer 6300 has a thickness of about 1 μm to about 500 μm.

The second heat conductive layer 6300 includes a second heat transfer part 6310 and a second heat discharge part 6320.

The second heat transfer part 6310 is covered by the second adiabatic layer 6400. In other words, the second heat transfer part 6310 corresponds to the second adiabatic layer 6400. The second heat transfer part 6310 directly makes contact with the second adiabatic layer 6400.

The second heat discharge part 6320 is exposed by the second adiabatic layer 6400. The second heat discharge part 6320 is integrally formed with the second heat transfer part 6310. The second heat discharge part 6320 may be exposed to the air.

The heat emitted from the heat radiation part 6020 to pass through the first adiabatic layer 6200 is transferred to the second heat discharge part 6320 through the second heat transfer part 6310. The second heat discharge part 6320 may discharge the heat transferred from the second heat transfer part 6310 to the air.

The second adiabatic layer 6400 is provided on the second heat conductive layer 6300. The second adiabatic layer 6400 covers a portion of the top surface of the second heat conductive layer 6300. The second adiabatic layer 6400 is directly provided on the top surface of the second heat conductive layer 6300. The second adiabatic layer 6400 exposes a portion of the second heat conductive layer 6300. In other words, the second adiabatic layer 6400 may cover the second heat conductive layer 6300 and expose the second heat discharge part 6320.

The second adiabatic layer 6400 may have a thickness of about 1 μm to about 500 μm.

The first adiabatic layer 6200 may be provided on the first heat conductive layer 6100 while making the step difference from the first heat conductive layer 6100. In addition, the second adiabatic layer 6400 may be provided on the second heat conductive layer 6300 while making the step difference from the second heat conductive layer 6300.

In addition, the first thermal heat conductive layer 6100 and the second heat conductive layer 6300 may include materials representing higher thermal conductivity. The first and second adiabatic layers 6200 and 6400 may include materials representing lower thermal conductivity. In other words, the first and second adiabatic layers 6200 and 6400 may represent thermal conductivities lower than those of the first and second heat conductive layers 6100 and 6300.

In addition, an insulator is used as the first heat conductive layer 6100. The second heat conductive layer 6300 may include an insulator or a conductor.

The first heat conductive layer 6100 may include aluminum oxide, titanium oxide, silicon oxide, or silicon nitride. In addition, the first heat conductive layer 6100 may include metallic particles or polymer doped with inorganic particles.

The second heat conductive layer 6300 may include aluminum oxide, titanium oxide, silicon oxide, or silicon nitride. In addition, the second heat conductive layer 6300 may include metallic particles or polymer doped with inorganic particles.

In addition, the second heat conductive layer 6300 may include a conductive metallic oxide. For example, the second heat conductive layer 6300 may include indium tin oxide, indium zinc oxide, Al doped zinc oxide, or indium tin zinc oxide. In addition, the second heat conductive layer 6300 may include metallic mesh.

In addition, the first and second adiabatic layers 6200 and 6400 may include polymer representing lower thermal conductivity like silicon resin, acrylic resin, or epoxy resin. In addition, the first and second adiabatic layers 6200 and 6400 may include pores. In more detail, the first and second adiabatic layers 6200 and 6400 may include an oxide layer including pores.

The first heat conductive layer 6100, the first adiabatic layer 6200, the second heat conductive layer 6300, and the second adiabatic layer 6400 may be formed through a deposition process.

As described above, although the heat radiation part 6020 has been described in that the heat radiation part 6010 includes four layers, but the embodiment is not limited thereto. In other words, the heat radiation part 6020 may include two layers or at least six layers. In other words, the heat radiation part 6020 may include at least six thin films in total by laminating at least heat conductive layer and at least one adiabatic layer on each other.

The light conversion parts 5100, 5200, and 5300 are provided on the heat radiation part 6020. The light conversion parts 5100, 5200, and 5300 are directly provided on the heat radiation part 6020. The light conversion parts 5100, 5200, and 5300 directly make contact with the top surface of the heat radiation part 6020. In more detail, the light conversion parts 5100, 5200, and 5300 are provided on the top surface of the second adiabatic layer 6400. The light conversion parts 5100, 5200, and 5300 may be directly provided on the top surface of the second adiabatic layer 6400.

The capping part 4300 covers the light conversion parts 5100, 5200, and 5300. The capping part 4300 seals the light conversion parts 5100, 5200, and 5300. The capping part 4300 includes a curved surface and may perform a lens function.

As described above, the light conversion parts 5100, 5200, and 5300 are provided on the heat radiation part 6020. Since the heat radiation part 6020 discharges the heat emitted from the light emitting part 3000 in a side direction, the heat applied to the light conversion parts 5100, 5200, and 5300 can be reduced.

Therefore, the light emitting device package according to the embodiment can prevent the light conversion particles 5110, 5210, and 5310 contained in the light conversion parts 5100, 5200, and 5300 from being degraded and can represent improved reliability and improved durability.

In addition, according to the light emitting device package of the embodiment, the light emitting part 3000 is provided on the substrate 1300, and the heat radiation part 6020 is provided on the light emitting part 3000. In other words, since the heat radiation part 6020 is provided on the top surface of the substrate 1300, the heat radiation part 6020 may be realized in the heat radiation structure having the form of a thin film. In other words, since the heat radiation part 6020 is provided on the top surface, the lateral side, and the bottom surface of the substrate 1300, the heat radiation structure having the shape of the step can be easily realized.

Therefore, when comparing with the heat radiation structure formed in the body having a cup structure, the heat radiation part 6020 formed on the substrate 1300 can represent more improved heat radiation characteristics with a thinner thickness.

Therefore, according to the light emitting device package of the embodiment, the interval between each of the light conversion parts 5100, 5200, and 5300 and the light emitting part 3000 can be reduced. Therefore, the light emitting device package according to the embodiment has a slimmer structure.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light emitting device comprising:
a body having a cavity;
a light emitting part in the cavity;
a light conversion part on a path of a light from the light emitting part;
a first capping part interposed between the light emitting part and the light conversion part; and
a heat transfer part in the first capping part,
wherein the light conversion part comprises:
a first light conversion lens part; and
a second light conversion lens part beside the first light conversion lens part, and
wherein the heat transfer part includes a light transmissive part.

2. The light emitting device of claim 1, wherein the first and second light conversion lens parts comprise a curved surface.

3. The light emitting device of claim 1, wherein the first light conversion lens part converts the light from the light emitting part into a light having a first wavelength band, and the second light conversion lens part converts the light from the light emitting part into a light having a second wavelength band.

4. The light emitting device of claim 3, wherein the light conversion part further comprises a third light conversion lens part provided beside the second light conversion lens part to convert the light from the light emitting part into a light having a third wavelength band.

5. The light emitting device of claim 1, further comprising a second capping part covering the light conversion part, wherein the first capping part represents thermal conductivity higher than thermal conductivity of the second capping part.

6. The light emitting device of claim 4, further comprising a transmissive region between the light conversion lens parts.

7. A light emitting device comprising:
a substrate;
a light emitting part on the substrate;
a heat radiation part covering the light emitting part; and
a light conversion part on the heat radiation part,
wherein the heat radiation part comprises:
a first heat conductive layer covering the light emitting part;
a first adiabatic layer on the first heat conductive layer;
a second heat conductive layer on the first adiabatic layer; and
a second adiabatic layer on the second heat conductive layer.

8. The light emitting device of claim 7, wherein the first adiabatic layer covers a portion of a top surface of the first heat conductive layer, and wherein the first heat conductive layer comprises:
a first heat transfer part corresponding to the first adiabatic layer; and
a first heat discharge part extending from the first heat transfer part and exposed from the first adiabatic layer.

9. The light emitting device of claim 8, wherein the second adiabatic layer covers a portion of a top surface of the second heat conductive layer, and
wherein the second heat conductive layer comprises:
a second heat transfer part corresponding to the second adiabatic layer; and
a second heat discharge part extending from the second heat transfer part and exposed from the second adiabatic layer.

10. The light emitting device of claim 4, wherein the heat transfer part includes a transparent layer.

* * * * *